US009107315B2

(12) United States Patent
Yang

(10) Patent No.: US 9,107,315 B2
(45) Date of Patent: Aug. 11, 2015

(54) VIA STRUCTURE IN MULTI-LAYER SUBSTRATE

(75) Inventor: Chih-kuang Yang, Hsin-Chu (TW)

(73) Assignee: PRINCO MIDDLE EAST FZE, Dubai (AE)

( * ) Notice: Subject to any disclaimer, the term of this patent is extended or adjusted under 35 U.S.C. 154(b) by 410 days.

(21) Appl. No.: 12/582,647

(22) Filed: Oct. 20, 2009

(65) Prior Publication Data

US 2010/0108363 A1    May 6, 2010

(30) Foreign Application Priority Data

Oct. 31, 2008  (TW) .............................. 097142237 A

(51) Int. Cl.
*H05K 1/11*      (2006.01)
*H05K 3/40*      (2006.01)
*H05K 1/03*      (2006.01)
*H05K 3/04*      (2006.01)

(52) U.S. Cl.
CPC .............. *H05K 1/116* (2013.01); *H05K 1/115* (2013.01); *H05K 3/4076* (2013.01); *H05K 1/0393* (2013.01); *H05K 3/048* (2013.01); *H05K 2201/09509* (2013.01); *H05K 2201/09545* (2013.01); *H05K 2201/09645* (2013.01); *H05K 2201/09827* (2013.01); *Y10T 29/49204* (2015.01)

(58) Field of Classification Search
CPC ..... H05K 1/115; H05K 1/116; H05K 1/0393; H05K 2201/09827; H05K 2201/09509; H05K 2201/09545
USPC ......... 174/250, 254, 255, 261, 262, 258, 266; 257/774, 773, 692
See application file for complete search history.

(56) References Cited

U.S. PATENT DOCUMENTS

| 4,933,303 | A |   | 6/1990 | Mo |  |
| 4,980,270 | A |   | 12/1990 | Inasaka |  |
| 5,320,981 | A | * | 6/1994 | Blalock | 438/640 |
| 5,322,816 | A |   | 6/1994 | Pinter |  |
| 5,338,975 | A | * | 8/1994 | Cole et al. | 257/750 |
| 5,427,980 | A | * | 6/1995 | Kim | 438/640 |
| 5,477,086 | A | * | 12/1995 | Rostoker et al. | 257/737 |
| 5,826,330 | A | * | 10/1998 | Isoda et al. | 29/852 |
| 6,372,637 | B2 | * | 4/2002 | Tang | 438/640 |
| 6,492,597 | B2 | * | 12/2002 | Fujii et al. | 174/255 |

(Continued)

FOREIGN PATENT DOCUMENTS

| CN | 1146043 | C | 4/2004 |
| CN | 1763941 | A | 4/2006 |

(Continued)

*Primary Examiner* — Angel R Estrada
*Assistant Examiner* — Dimary Lopez Cruz

(57) ABSTRACT

Disclosed is a via structure in a multi-layer substrate, comprising a first metal layer, a dielectric layer and a second metal layer. The first metal layer has an upper surface. The dielectric layer covers the first metal layer in which a via is opened to expose the upper surface. The second metal layer is formed in the via and contacts an upper surface and an inclined wall of the via. A contacting surface of the second metal layer has a top line lower than the upper edge of the inclined wall. Alternatively, the second metal layer can be formed on the dielectric layer as being a metal line simultaneously as formed in the via as being a pad. The metal line and the pad are connected electronically. The aforesaid metal second layer can be formed in the via and on the dielectric layer by a metal lift-off process.

9 Claims, 7 Drawing Sheets

(56) References Cited

U.S. PATENT DOCUMENTS

| | | | |
|---|---|---|---|
| 6,548,224 B1 * | 4/2003 | Chen et al. | 430/314 |
| 6,762,107 B2 * | 7/2004 | Watanabe et al. | 438/393 |
| 6,815,825 B2 * | 11/2004 | Tang | 257/774 |
| 6,864,577 B2 * | 3/2005 | Clatanoff et al. | 257/737 |
| 7,476,812 B2 * | 1/2009 | Nakajima et al. | 174/254 |
| 7,807,567 B2 * | 10/2010 | Kawano et al. | 438/640 |
| 7,834,273 B2 * | 11/2010 | Takahashi et al. | 257/774 |
| 7,957,154 B2 * | 6/2011 | Ito et al. | 361/765 |
| 8,017,875 B2 * | 9/2011 | Kawamura et al. | 174/260 |
| 8,119,918 B2 * | 2/2012 | Sato et al. | 174/254 |
| 8,673,428 B2 * | 3/2014 | Naoyuki et al. | 428/172 |
| 2002/0179333 A1 | 12/2002 | Suzuki et al. | |
| 2005/0062160 A1 * | 3/2005 | Naito et al. | 257/755 |
| 2006/0108143 A1 | 5/2006 | Hsu et al. | |
| 2007/0200211 A1 * | 8/2007 | Kobayashi et al. | 257/676 |
| 2008/0202803 A1 * | 8/2008 | Nagase et al. | 174/262 |
| 2008/0296273 A1 * | 12/2008 | Lei et al. | 219/121.71 |
| 2009/0095514 A1 * | 4/2009 | Kaneko | 174/258 |

FOREIGN PATENT DOCUMENTS

| | | |
|---|---|---|
| JP | 1-211947 A | 8/1989 |
| JP | 9-283624 A | 10/1997 |
| JP | 9283624 A | 10/1997 |
| JP | 2002-261423 | 9/2002 |
| JP | 2005-085961 | 3/2005 |
| TW | I257273 B | 6/2006 |
| TW | I328992 B | 8/2010 |
| WO | 9819337 | 5/1998 |
| WO | 9827588 | 6/1998 |

* cited by examiner

VIA STRUCTURE IN MULTI-LAYER SUBSTRATE

BACKGROUND OF THE INVENTION

1. Field of the Invention

The present invention generally relates to a via structure in multi-layer substrate, and more particularly to a via structure in multi-layer substrate and/or in a flexible multi-layer substrate.

2. Description of Prior Art

Miniaturization of all electronic products is an inevitable trend in this modern world. While the scales of the semiconductor chips continuously get smaller, the scale of the related technology for packaging needs to be microminiaturized to follow the scale of the semiconductor chip is also inevitably getting smaller. Today, because the routing density of integrated circuits has been greatly increased, using a multi-layer substrate as being a package substrate, a print circuit board, a flexible package substrate or a flexible print circuit board and for obtaining a high performance integration system must be developed consequentially. Particularly, the flexible multi-layer substrate should be mentioned to become efficiently adoptable in variable electronic products for miniaturization. Generally, the metal lines and the via structures of the multi-layer substrate are manufactured by etching or semi-additive methods according to prior arts. The higher the circuit routing density increases, the finer the metal line and the via structure are requested. The fine-pitch products well known in the related industry field are generally meant to be high integration products.

Please refer to FIG. 1, which depicts a diagram of a via structure in a multi-layer substrate according to prior arts. FIG. 1 only shows related parts of the multi-layer substrate with the via structure. The multi-layer substrate comprises a metal layer 102 as being the lower metal lines. A dielectric layer 104 covers metal layer 102. The via 106 is formed by laser or mechanical drill. The via 106 has a vertical via wall. After the via 106 is formed and metal material is filled therein. With a metal layer 108 as a via land, the electrical connection between metal layer 102 and other upper metal layers of the dielectric layer 104 is objected to be established. When the multi-layer substrate comprises such kind of via structure and is applied to be bended. The metal layer 108 at the position 110 which is connected with the metal material in the via 106 and aligned to the edge of the dielectric layer 104 can be easily peeled off or even broken. Same issue can frequently happen at the position 112 where the metal layer 102 and the metal material in the via 106 connect.

The via structure is an important part for the electrical connection between different metal layers in the multi-layer substrate. When the via structure is manufactured in the flexible multi-layer substrate, and more particularly in the frequently bended area of the flexible multi-layer substrate, there is higher possibility that the position 110 of the metal layer 108 aligned to the edge of the dielectric layer 104 peels off or even breaks. The position 112 connecting the metal layer 102 and the metal material in the via 106 also peels off or even breaks with higher possibility, similarly. Meanwhile, the via land size A of such via structure has to be larger than the via diameter B. In consequence of limitation about the via pitches and metal line pitches of the multi-layer substrate, application to the high integration products will be failed.

Please refer to FIG. 2, which depicts a diagram of another via structure in a multi-layer substrate according to prior arts. Similarly, a metal layer 202 is formed and prepared for manufacturing the lower metal lines. A dielectric layer 204 covers metal layer 202 and includes the via 206. After the via 206 is formed and then via land is formed therein to establish the electrical connection between metal layer 202 and other metal layers above the dielectric layer 204. When the multi-layer substrate is frequently bended, the position 212 connecting the metal layer 202 and via land peels off with higher possibility. Especially when the via depth C becomes deeper, the possibility of the position 212 peeling off may be almost the same as that of the position 112 peeling off shown in FIG. 1. Meanwhile, as the via structures of the multi-layer substrate are manufactured by etching or semi-additive methods according to prior arts, the process tolerance has to be further considered (More details will be described later). Therefore, the via land size A of such kind of via structure has to be larger than the via diameter B. Still, in consequence of limitation about the via pitches and metal line pitches of the multi-layer substrate, further application to the higher routing density today cannot be realized.

Please refer to FIG. 3A and FIG. 3B, which depict diagrams of manufacturing a via structure by etching method according to prior arts at the same time. A metal layer 302 is formed in advance when the via structure is manufactured by etching method. The dielectric layer 304 is formed and covers the metal layer 302. Then, a via 306 is formed. Next, a metal layer 308 for manufacturing the via land 300 is formed to fill in the via 306. Meanwhile, the metal layer 308 also covers the dielectric layer 304. Afterward, a photoresist layer 310 is coated at the position of manufacturing via land. After the photoresist layer 310 is coated, the uncovered metal layer 308 with the photoresist layer 310 is etched and removed.

Because the etching is isotropic, not only the uncovered metal layer 308 is etched but the side surface of the via land is also etched. For example, the via land will be etched to shrink back to the position of dot lines 314. Therefore, an undercut structure happens to the via land as shown in FIG. 3. If the etching method is employed to manufacture the via structures of the multi-layer substrate, the photoresist layer 310 cannot determine the via land size exactly. Accordingly, the via land size cannot be further minified because the design tolerance of the etching process has to be considered. As finer the metal lines and sizes of the via structures are required, the etching method has limitation and cannot satisfy coming demands of the multi-layer substrate products.

Please refer to FIG. 4A to FIG. 4C, which depict diagrams of manufacturing a via structure by SAP, semi-additive process. First, a metal layer 402 is formed and then the dielectric layer 404 is formed to cover the metal layer 402 when the via structure is manufactured by etching method. Then, a via 406 is formed. Next, a seed metal layer 407 is formed. Afterward, a photoresist layer 410 is coated except the position of manufacturing via land. And then, a metal layer is formed to fill in the position of the via land. The seed metal layer 407 except the position of the via land 400 is removed by the etching method after the photoresist layer 410 is removed as shown in FIG. 4B and FIG. 4C to finish the process of manufacturing the via structure.

However, the via land 400 will be etched and shrinks back to the position of dot lines 414 as shown in FIG. 4B while the seed metal layer 407 except the position of the via land 400 is removed. Consequently, the via land 400 which's size is smaller than what the photoresist layer 410 originally defines is formed as shown in FIG. 4C. Similar drawback appears, if the semi-additive process method is employed to manufacture the via structures of the multi-layer substrate, the photoresist layer 410 cannot determine the via land 400 size exactly. Because the design tolerance of the semi-additive process has to be further considered and via land size accordingly cannot be minified. As finer the metal lines and sizes of the via structures are required strictly, the semi-additive method also has limitation and cannot satisfy coming demands of the multi-layer substrate products today and in the near future.

In conclusion, there is a need to develop a via structure in a multi-layer substrate and manufacturing method which the via land is inside the via to diminish the possibility of aforesaid peeling off or even breaking. The manufacturing tolerances of metal lines and via lands of the multi-layer substrate can be further reduced. Therefore, routing density can be increased and an electrical system can be easily integrated in more functions on a substrate. Moreover, the via structure in a multi-layer substrate can be applied to the flexible multi-layer substrates and raise the reliability of the package substrates.

SUMMARY OF THE INVENTION

An objective of the present invention is to provide a via structure in a multi-layer substrate to apply in the field of manufacturing package substrates, print circuit boards, flexible package substrates and flexible print circuit boards. The via land of the present invention is smaller than the via therefore, to decrease the pitches among the vias and the metal lines (fine-pitch) to increase the routing density of the aforesaid substrates and print circuit boards.

Another objective of the present invention is to provide a via structure in a multi-layer substrate to apply in frequently bended areas of the flexible package substrates and the flexible print circuit boards to promote the reliabilities thereof.

The via structure in the multi-layer substrate of the present invention comprises a first metal layer, a dielectric layer and a second metal layer. The first metal layer has an upper surface. The dielectric layer covers the first metal layer in which a via is opened to expose the upper surface and the via has an inclined wall with an upper edge. The second metal layer is formed in the via and contacts the upper surface and the inclined wall. A contacting surface of the second metal layer has a top line lower than the upper edge of the inclined wall. Alternatively, the second metal layer can be formed on the dielectric layer as being a metal line simultaneously as formed in the via as being a pad. The metal line and the pad are connected electronically. The aforesaid metal second layer can be formed in the via and on the dielectric layer by a metal lift-off process.

The present invention also provides a manufacturing method of a via structure in a multi-layer substrate. The manufacturing method comprises steps below:
  forming a first metal layer having an upper surface;
  forming a dielectric layer to cover the first metal layer;
  opening a via to expose the upper surface of the first metal layer and the via has an inclined wall with an upper edge;
  coating at least one photoresist layer on a surface of the dielectric layer and the upper surface of the first metal layer;
  proceeding a photolithography process to the photoresist layer;
  removing the photoresist layer in the via;
  forming a second metal layer in the via and on the photoresist layer coated on the surface of the dielectric layer, wherein the second metal layer in the via contacts the upper surface and the inclined wall; and
  removing the photoresist layer on the surface of the dielectric layer and the second metal layer formed on the photoresist layer.

Specifically, the via structure and the manufacturing method of the present invention can be applied in the field of package substrates. Meanwhile, the via structure and the manufacturing method can be employed in the technical field of manufacturing print circuit boards and flexible package substrates.

DETAILED DESCRIPTION OF THE INVENTION

Figure 1:
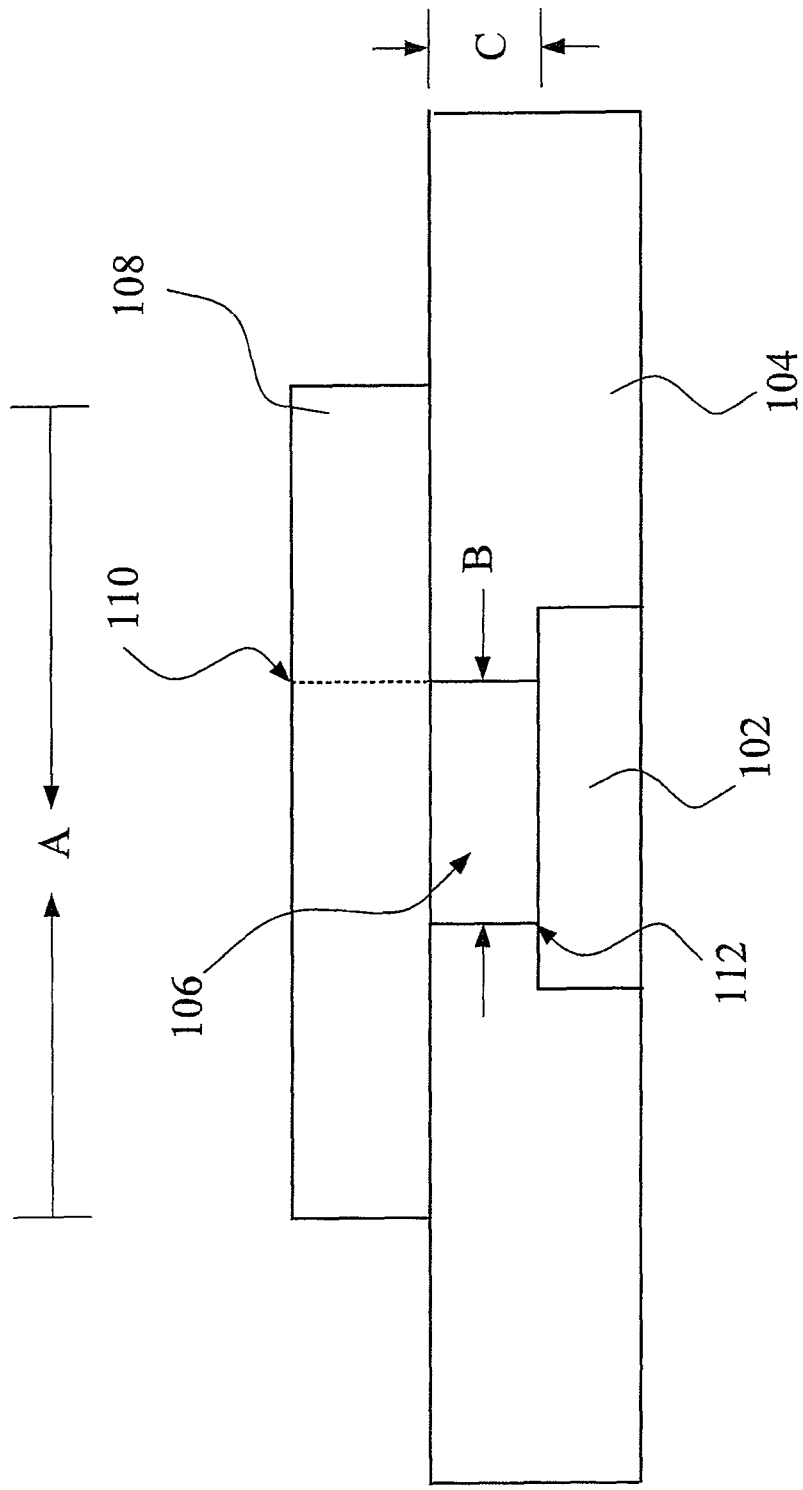
FIG. 1 depicts a diagram of a via structure in a multi-layer substrate according to prior arts.
Figure 2:
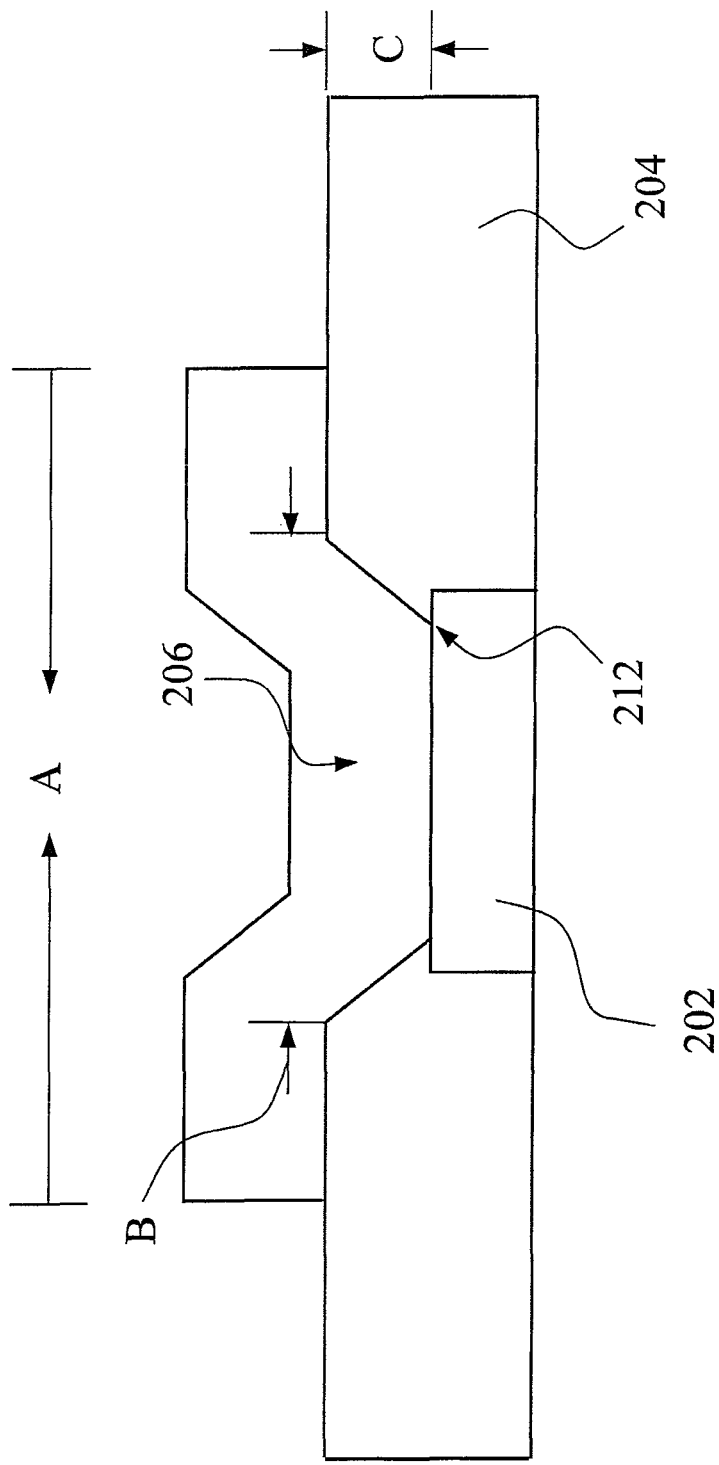
FIG. 2 depicts a diagram of another via structure in a multi-layer substrate according to prior arts.
Figure 3A:
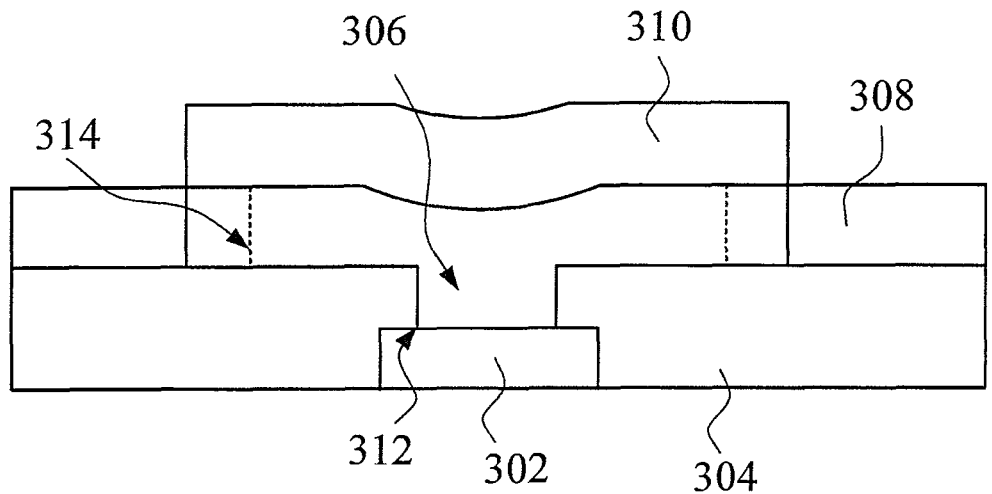
FIG. 3A and FIG. 3B depict diagrams of manufacturing a via structure by etching method according to prior arts.
Figure 3B:
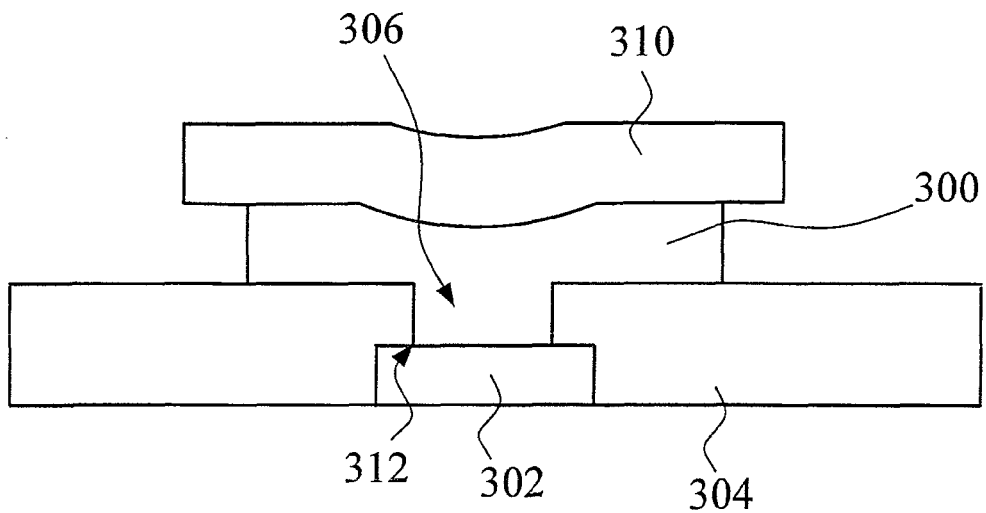
Figure 4A:
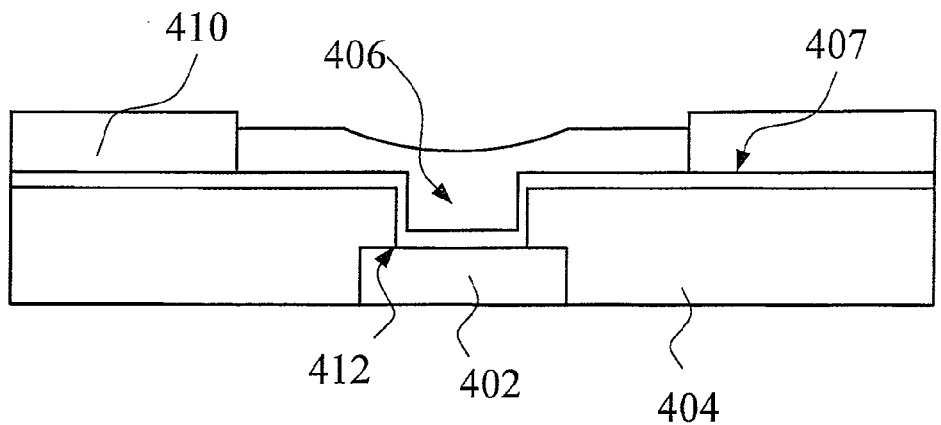
FIG. 4A to 4C depict diagrams of manufacturing a via structure by semi-additive process.
Figure 4B:
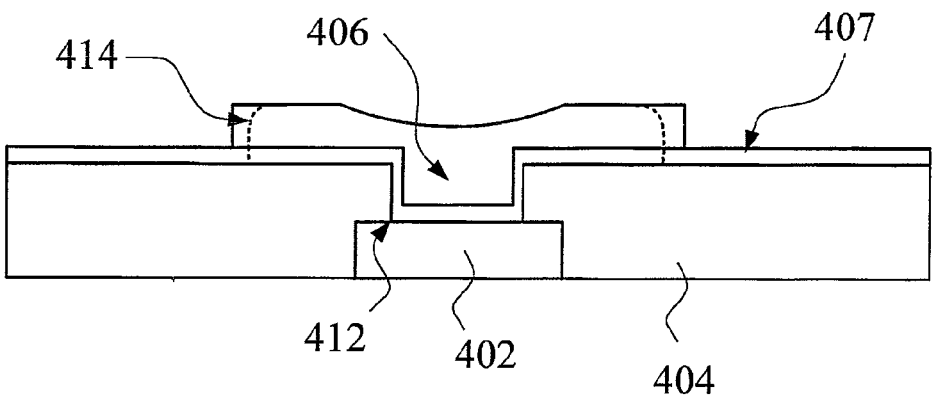
Figure 4C:
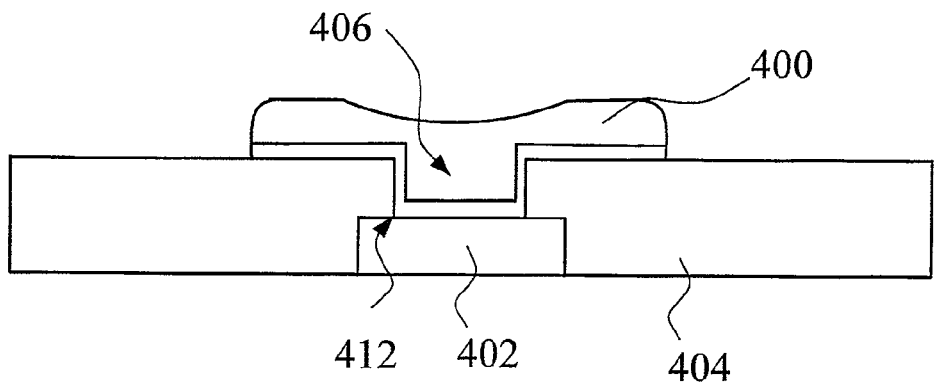
Figure 5:
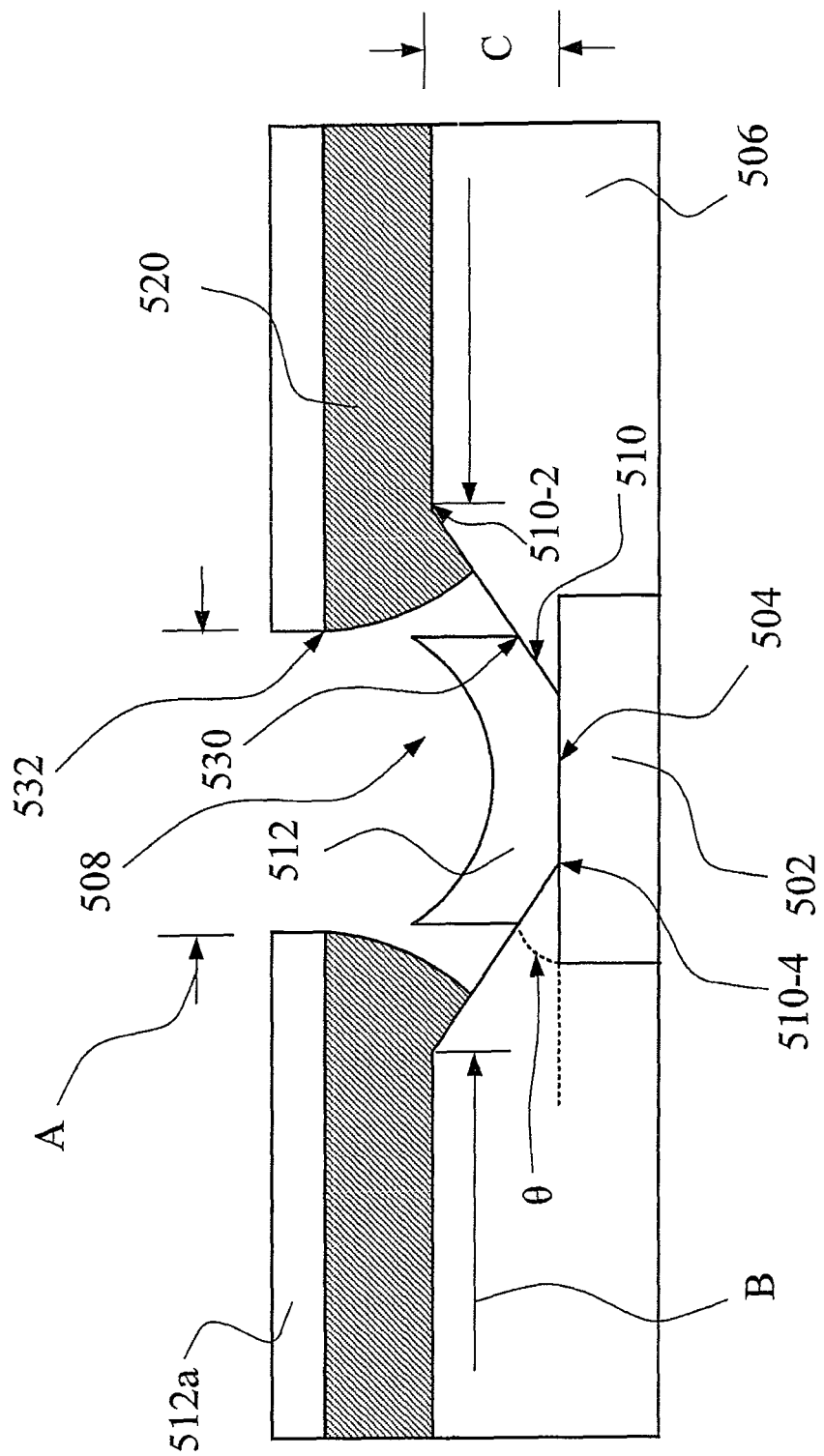
FIG. 5 depicts a diagram of a first embodiment of a via structure in a multi-layer substrate according to the present invention.

Please refer to FIG. 5, which depicts a diagram of a first embodiment of a via structure in a multi-layer substrate according to the present invention. In FIG. 5, only the related parts of the multi-layer substrate to the present invention are shown. The multi-layer substrate of the present invention comprises a first metal layer 502 having an upper surface 504. A dielectric layer 506 covers the first metal layer 502. The dielectric layer 506 is opened with a via 508 to expose the upper surface 504. The via 508 has an inclined wall 510. The inclined wall 510 has an upper edge 510-2. A second metal layer is formed in the via 508 as being a via land 512. The via land 512 contacts the upper surface 504 and with the inclined wall 510. A contacting surface of the via land 512 contacting with the upper surface 504 and the inclined wall 510 has a top line 530. The top line 530 is lower than the upper edge 510-2 of the inclined wall 510 and higher than a lower edge 510-4 of the inclined wall 510. Significantly, the size of via land 512 is smaller than the area enclosed by the upper edge 510-2 of the dielectric layer 506. The via land 512 is inside the via 508.

The materials of the first metal layer 502 and via land 512 (the second metal layer) can be copper. The material of the dielectric layer 506 can be PI (polyimide) and coated to cover the first metal layer 502. The second metal layer 512 can be formed inside the via 508 by metal lift-off process (More detail will be described later). Because the via land 512 of the via structure in the multi-layer substrate according to the present invention is located inside the via 508. Unlike prior arts that the via land size cannot be exactly defined by processes and hardly to be formed precisely on the inclined wall, i.e. the via wall, the via land size therefore, has to be larger than the via diameter. Comparing to prior arts, the present invention can further minify the via pitches and metal line pitches of the multi-layer substrate and significantly increase the routing density of the multi-layer substrate.

Furthermore, with the via land 512 which is formed in the via 508 by the metal lift-off process according to the present invention, the adhesion of the via land 512 to the first metal layer 502 and the inclined wall 510 of the dielectric layer 506 is well. Moreover, for approaching a smoother connection or contact between the via land 512 and the first metal layer 502, the inclined wall 510 of the dielectric layer 506, the via structure can have better pliability when the multi-layer substrate is bended. According to what the inventor tested and verified many times, the sharp angle formed by the upper surface 504 of the first metal layer 502 and the inclined wall 510, i.e. at the corner of the lower edge 510-4 is preferably less than 75°. Accordingly, the present invention still can maintain an original and complete via structure and without peeling or breaking, even the via structure is applied in the bendable areas in the flexible, bendable flexible print circuit boards or package substrates. The well electrical connection between the first metal layer 502 and the via land 512 still can be remained and therefore, raise the reliability of the multi-layer substrates.

The manufacturing method of the via structure by the metal lift-off process according to the present invention is described below:

forming a first metal layer 502;

forming a dielectric layer 506 to cover the first metal layer 502;

opening a via to expose the upper surface 504 of the first metal layer 502 and the via 508 has an inclined wall 510;

coating at least one photoresist layer 520 on a surface of the dielectric layer 506 and the upper surface 504;

proceeding a photolithography process to the photoresist layer 520;

removing the photoresist layer 520 in the via 508. For example, negative photoresist can be employed and developer is utilized to remove the photoresist layer 520 as shown in FIG. 5. The area enclosed by the upper edge 532 of the photoresist layer 520 can be controlled smaller than the area enclosed by the upper edge 510-2 of the inclined wall 510 and larger than the area enclosed by lower edge 510-4 of the inclined wall 510;

forming a second metal layer 512 in the via 508 and a second metal layer 512a on the photoresist layer 520 coated on the surface of the dielectric layer 506, wherein the second metal layer 512 in the via 508 contacts the upper surface 504 and the inclined wall 510; and removing the photoresist layer 520 on the surface of the dielectric layer 506 and the second metal layer 512a formed on the photoresist layer 520.

Figure 6:
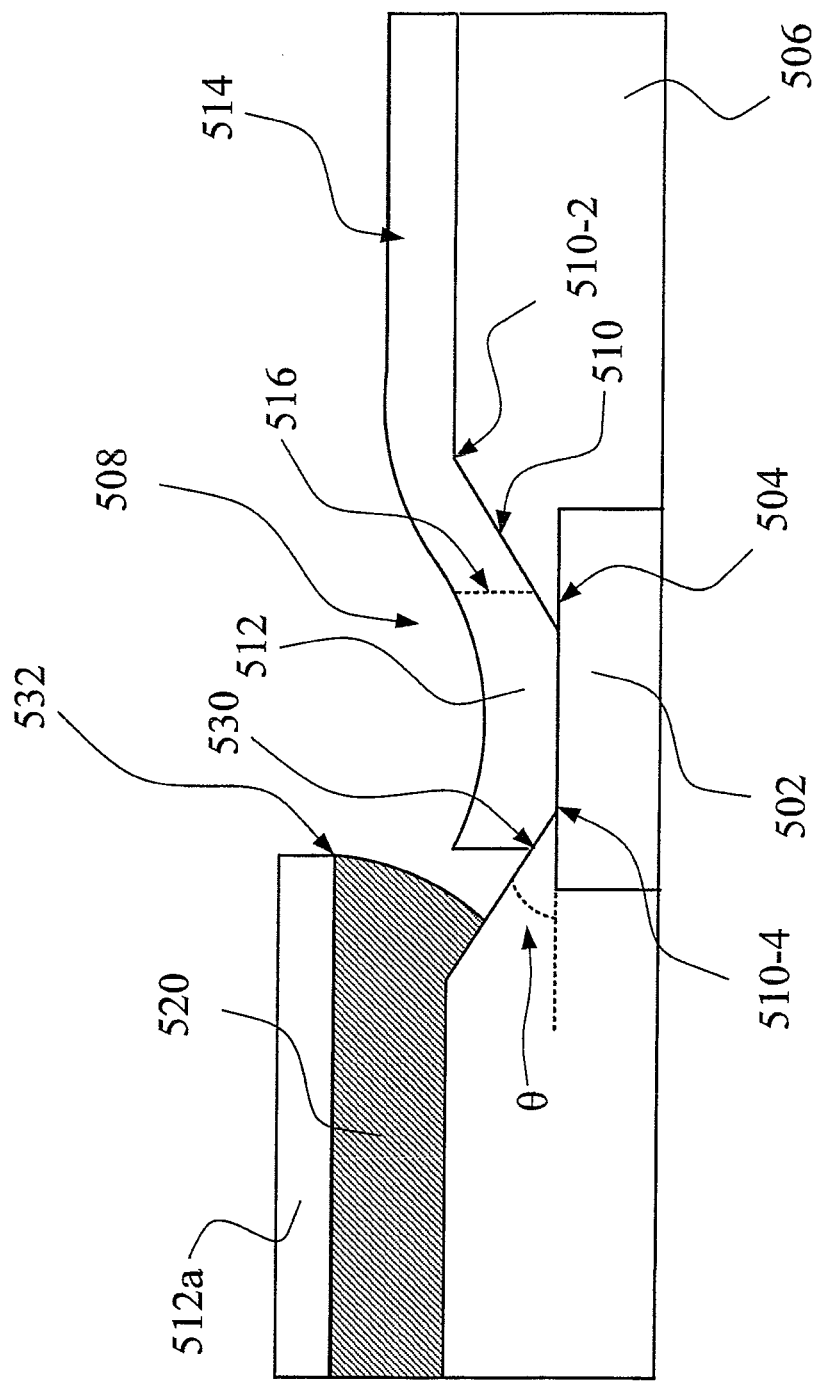
FIG. 6 depicts a diagram of a second embodiment of a via structure in a multi-layer substrate according to the present invention.

Herewith, the via structure of the present invention is accomplished. Significantly, in the present invention, the second metal layer formed in the via 508 is employed as being a via land 512. During the step of removing the photoresist layer 520 in the via 508, the photoresist layer 520 in a predetermined position on the surface of the dielectric layer 506 can be removed at the same time. As shown in FIG. 6, the second metal layer formed in the aforesaid predetermined position can be employed as being a metal line 514 and electrical connected with the via land 512. In the field of the present invention, the photoresist layer 520 is defined by a mask with a photolithography process. The upper edge 532 of the open of the photoresist layer 520 is defined and transprinted by a high precise photolithography process. Therefore, a advantage of the present invention better than prior arts is: the appearance and area are defined by the upper edge 532 of the open of the photoresist layer 520 on the surface of the dielectric layer 506 which is almost cognate with the size of the mask, i.e. the original design specification of the circuit. The present invention definitely gets rid of drawbacks of etching or semi-additive methods which lead the via size is unable to be defined precisely by the photoresist layer. Even facing more and more strict requirements of the metal lines and via structures, the present invention still can satisfy the coming demands of the multi-layer substrates today and in the near future.

For the related industry field of the fine pitch products today, the reasonable expected via depth is about 40 μm. The via diameter is about 40 μm and the size limitation of the via land size is approaching 70 μm. On the contrary, with the present invention, the smallest and possible size of the via depth can approach to merely 3 μm. The via diameter can approach only 5 μm and the size limitation of the via land size can be as small as 7 μm.

Figure 7:
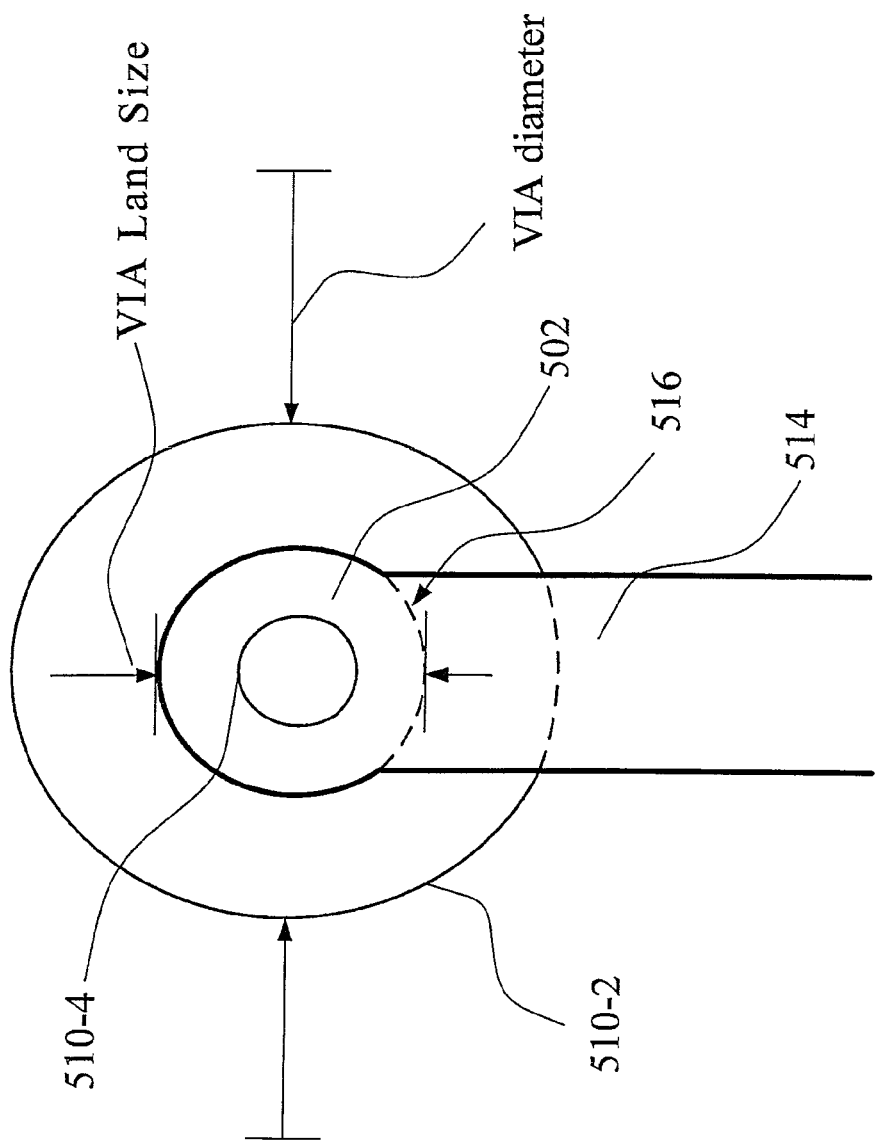
FIG. 7 depicts a vertical view diagram of the second embodiment of the via structure in the multi-layer substrate according to the present invention.

Please refer to FIG. 7 with FIG. 6. FIG. 6 depicts a diagram of a second embodiment of a via structure in a multi-layer substrate according to the present invention. FIG. 7 depicts a vertical view diagram of the second embodiment of the via structure in the multi-layer substrate according to the present invention. In FIG. 6, only the related parts of the multi-layer substrate to the present invention are shown. The multi-layer substrate of the present invention comprises a first metal layer 502 having an upper surface 504. A dielectric layer 506 covers the first metal layer 502. The dielectric layer 506 is opened with a via 508. The via 508 has an inclined wall 510. A second metal layer is formed in the via 508 as being a via land 512 and on the surface of the dielectric layer 506 as being a metal line 514. The via land 512 contacts with the upper surface 504 and with the inclined wall 510. A contacting surface of the via land 512 contacting with the upper surface 504 and the inclined wall 510 has a top line 530. The top line 530 is lower than the upper edge 510-2 of the inclined wall 510 and higher than a lower edge 510-4 of the inclined wall 510. Significantly, the size of via land 512 is smaller than the area enclosed by the upper edge 510-2 of the dielectric layer 506. The via land 512 is inside the via 508.

What the second embodiment is different from the first embodiment of the present invention is that the photoresist layer 520 in a predetermined position on the surface of the dielectric layer 506 can be removed at the same time as removing the photoresist layer 520 (not shown) in the via 508. The predetermined position can be formed for manufacturing a metal line 514 (such as a slot, not shown in figure). Afterward, the second metal layer is formed in the via 508 and in the predetermined position for as being the via land 512 and the metal line 514 respectively at the same time. Alternatively, different metal layers can be formed with different processes as being the via land 512 and the metal line 514 but still connected with each other. The electrical connection between different metal layers still can be accomplished. Similar as the first embodiment, a smoother connection or contact between the via land 512 and the first metal layer 502, the inclined wall 510 of the dielectric layer 506 can be realized. The connection between the via land 512 and the metal line 514 also can be smoother thereby. Besides, the metal line 514 also becomes smoother around the upper edge 510-2 and is still capable of remaining well pliability when the multi-layer substrate is bended herewith frequently. According to what the inventor tested and verified many times, the sharp angle formed by the upper surface 504 of the first metal layer 502 and the inclined wall 510, i.e. at the corner of the lower edge 510-4 is preferably less than 75°.

As shown in FIG. 7, the boundary between the via land 512 and the metal line 514 is the dot line 516 in general. According to the via structure in the multi-layer substrate of the present invention, the via land 512 is "inside" the via 508, i.e. smaller than the area enclosed the upper edge 510-2 and larger than the area enclosed by lower edge 510-4. Consequently, the via land 512 can be smaller than via diameter, therefore, the routing density can be increased. Meanwhile, with well connection (physically and electrically) between the via land 512 and the metal line 514, the possibility of peeling off or even breaking can be decreased. The present invention can further minify the size of the multi-layer substrates and significantly increase the routing density thereof. When the present invention is applied in the flexible print circuit boards and flexible package substrates which are both widely used in many aspects, the reliability of the boards or the substrates can be raised definitely.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A via structure in a multi-layer substrate, comprising:
   a first metal layer, having an upper surface;
   a dielectric layer, covering the first metal layer in which a via is opened to expose the upper surface and the via has an inclined wall with an upper edge; and
   a second metal layer, formed in the via and contacting the upper surface, the inclined wall, wherein a contacting surface of the second metal layer has a top line lower than the upper edge of the inclined wall and an acute angle formed by the upper surface of the first metal layer and the inclined wall is smaller than 75° and the multi-layer substrate is flexible, wherein the via structure can be maintained complete as being bent in bendable areas of the multi-layer substrate,
   wherein the second metal layer is completely formed in the via and formed on a part of the inclined wall.

2. The via structure of claim 1, wherein the top line of the contacting surface is higher than a lower edge of the inclined wall.

3. The via structure of claim 1, wherein the second metal layer is further formed above the dielectric layer employed as being a metal line and the second metal layer in the via is employed as being a pad, wherein the metal line and the pad are formed at the same time.

4. The via structure of claim 1, wherein an area formed by a lower edge of the inclined wall is smaller than an area formed by the upper edge.

5. The via structure of claim 1, wherein a material of the dielectric layer is polyimide.

6. A via structure in a multi-layer substrate, comprising:
   a first metal layer, having an upper surface;
   a dielectric layer, covering the first metal layer in which a via is opened to expose the upper surface and the via has an inclined wall with an upper edge; and
   a second metal layer, formed in the via as being a pad and formed on the dielectric layer as being a metal line, wherein the second metal layer as being the pad contacts the upper surface, the inclined wall and a contacting surface of the pad has a top line lower than the upper edge of the inclined wall and an acute angle formed by the upper surface of the first metal layer and the inclined wall is smaller than 75° and the multi-layer substrate is flexible, wherein the via structure can be maintained complete as being bent in bendable areas of the multi-layer substrate,
   wherein the second metal layer is completely formed in the via and formed on a part of the inclined wall.

7. The via structure of claim 6, wherein the top line of the contacting surface is higher than a lower edge of the inclined wall.

8. The via structure of claim 6, wherein an area formed by a lower edge of the inclined wall is smaller than an area formed by the upper edge.

9. The via structure of claim 6, wherein a material of the dielectric layer is polyimide.

* * * * *